United States Patent
Sakaue

(10) Patent No.: US 11,798,605 B2
(45) Date of Patent: Oct. 24, 2023

(54) MEMORY SYSTEM

(71) Applicant: Kioxia Corporation, Tokyo (JP)

(72) Inventor: Kenji Sakaue, Yokohama (JP)

(73) Assignee: Kioxia Corporation, Tokyo (JP)

( * ) Notice: Subject to any disclaimer, the term of this patent is extended or adjusted under 35 U.S.C. 154(b) by 85 days.

(21) Appl. No.: 17/470,411

(22) Filed: Sep. 9, 2021

(65) Prior Publication Data

US 2022/0293149 A1 Sep. 15, 2022

(30) Foreign Application Priority Data

Mar. 15, 2021 (JP) .................................. 2021-041369

(51) Int. Cl.
G11C 7/22 (2006.01)
G11C 7/10 (2006.01)

(52) U.S. Cl.
CPC ............ *G11C 7/222* (2013.01); *G11C 7/1003* (2013.01); *G11C 7/109* (2013.01); *G11C 7/1048* (2013.01); *G11C 7/1063* (2013.01)

(58) Field of Classification Search
CPC ..... G11C 7/222; G11C 7/1003; G11C 7/1048; G11C 7/1063; G11C 7/109; G11C 8/12
USPC ....................................................... 365/233.1
See application file for complete search history.

(56) References Cited

U.S. PATENT DOCUMENTS

| | | | |
|---|---|---|---|
| 8,230,129 B2 | 7/2012 | Sumi et al. | |
| 2006/0123164 A1 | 6/2006 | Rai et al. | |
| 2007/0216553 A1 | 9/2007 | Rai et al. | |
| 2011/0258399 A1* | 10/2011 | Sumi | G06F 13/1694 |
| | | | 711/E12.001 |
| 2020/0235091 A1* | 7/2020 | Kang | H01L 23/5225 |
| 2022/0050621 A1* | 2/2022 | Park | G06F 3/0679 |
| 2022/0350890 A1* | 11/2022 | Chang | G06F 13/1668 |

FOREIGN PATENT DOCUMENTS

| | | |
|---|---|---|
| JP | 2006-127653 A | 5/2006 |
| JP | 5467134 B1 | 4/2014 |

* cited by examiner

*Primary Examiner* — Hoai V Ho
*Assistant Examiner* — Minh Dinh
(74) *Attorney, Agent, or Firm* — Oblon, McClelland, Maier & Neustadt, L.L.P.

(57) ABSTRACT

According to one embodiment, there is provided a memory system including a controller, a plurality of memory chips, and a channel. The controller outputs a clock signal, a timing control signal and a data signal. Each of the plurality of memory chips includes at least a clock input terminal, a timing control input terminal, a timing control output terminal, a data input terminal and a data output terminal. The channel includes a loop bus which connects the controller and the plurality of memory chips in a ring shape. The controller is able to control operation timings of the memory chips by transmitting the clock signal and the timing control signal to the plurality of memory chips via the channel.

20 Claims, 12 Drawing Sheets

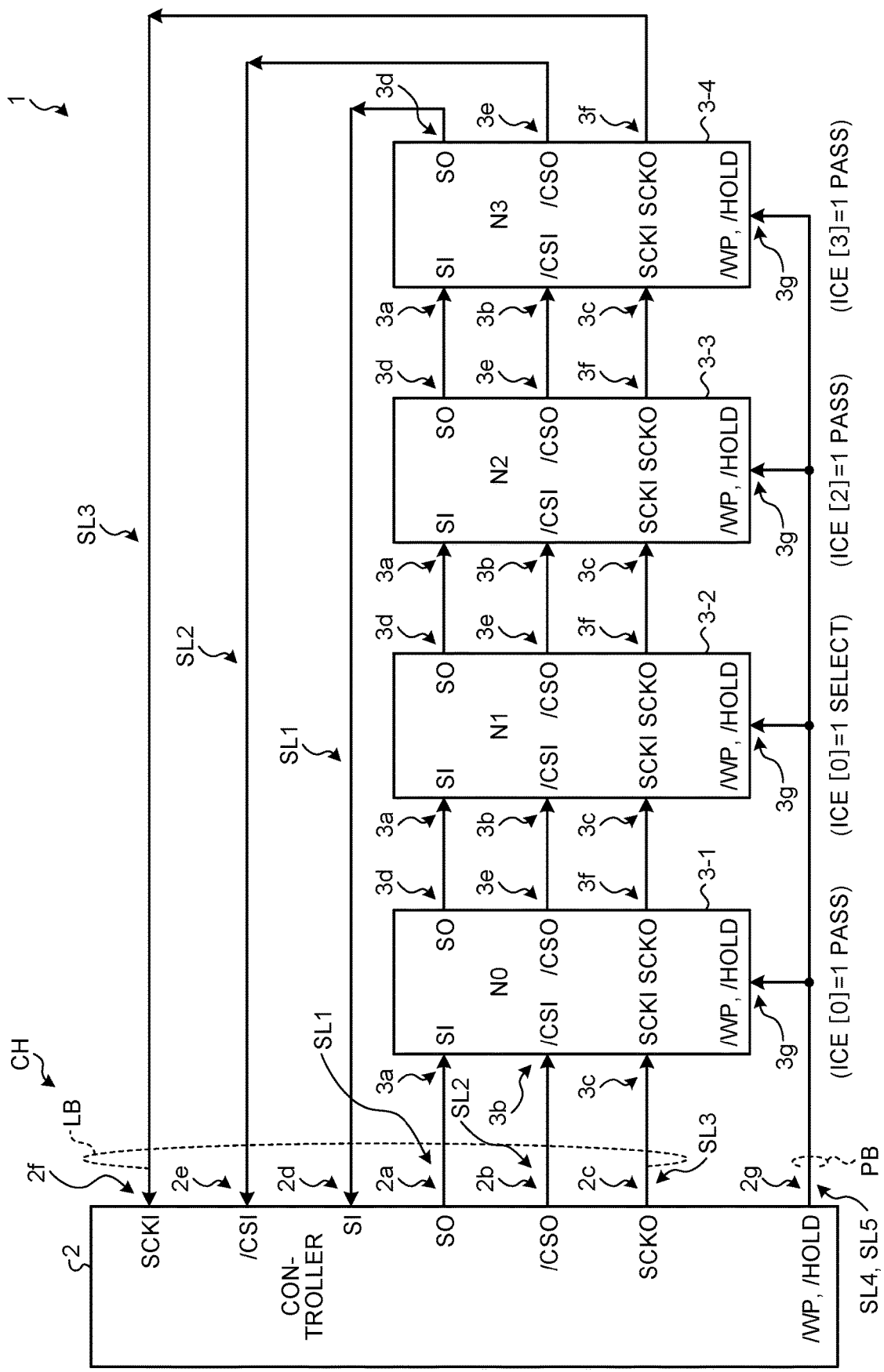

FIG.2

| | Operation | Byte 1 (CMD) | Byte 2 | Byte 3 | Byte 4 | Byte 5 | Byte N |
|---|---|---|---|---|---|---|---|
| CM1 | Read Cell Array | 13h | - | A15-A8 (Input) | A7-A0 (Input) | - | - |
| CM2 | Read Buffer | 03h/0Bh | Dummy | Dummy | Dummy | D*-D* (Output) | D*-D* (Output) |
| CM3 | Read Buffer x2 | 3Bh | Dummy + A11-A8 (Input) | A7-A0 (Input) | Dummy | D*-D* (Output) | D*-D* (Output) |
| CM4 | Read Buffer x4 | 6Bh | Dummy + A11-A8 (Input) | A7-A0 (Input) | Dummy | D*-D* (Input) | D*-D* (Input) |
| CM5 | Program Load | 02h | Dummy + A11-A8 (Input) | A7-A0 (Input) | D*-D* (Input) | D*-D* (Input) | D*-D* (Input) |
| CM6 | Program Execute | 10h | Dummy | A15-A8 (Input) | A7-A0 (Input) | - | - |
| CM7 | Protect Execute | 2Ah | Dummy | A15-A8 (Input) | A7-A0 (Input) | - | - |
| CM8 | Program Load Random Data | 84h | Dummy + A11-A8 (Input) | A7-A0 (Input) | D*-D* (Input) | D*-D* (Input) | D*-D* (Input) |
| CM9 | Block Erase | D8h | Dummy | A15-A8 (Input) | A7-A0 (Input) | - | - |
| CM10 | Reset | FFh/FEh | - | - | - | - | - |
| CM11 | Write Enable | 06h | - | - | - | - | - |
| CM12 | Write Disable | 04h | - | - | - | - | - |
| CM13 | Get Feature | 0Fh | A7-A0 (Input) | D7-D0 (Output) | D7-D0 (Output) | D7-D0 (Output) | D7-D0 (Output) |
| CM14 | Set Feature | 1Fh | A7-A0 (Input) | D7-D0 (Input) | - | - | - |
| CM15 | Read ID | 9Fh | Dummy | ID (Output) | ID (Output) | - | - |

MEMORY SYSTEM

CROSS-REFERENCE TO RELATED APPLICATIONS

This application is based upon and claims the benefit of priority from Japanese Patent Application No. 2021-041369, filed on Mar. 15, 2021; the entire contents of which are incorporated herein by reference.

FIELD

Embodiments described herein relate generally to a memory system.

BACKGROUND

In a memory system including a controller and a memory chip, a signal is transmitted from the controller to the memory chip via a channel. In this event, it is desired that the signal be appropriately transmitted.

BRIEF DESCRIPTION OF THE DRAWINGS

FIG. 1 is a view illustrating a configuration of a memory system according to a first embodiment;

FIG. 2 is a view illustrating a configuration of a command in the first embodiment;

DETAILED DESCRIPTION

Figure 3:
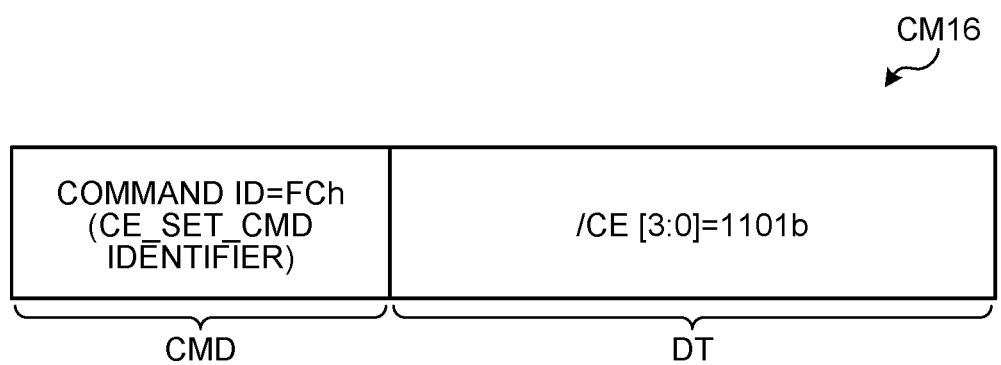
FIG. 3 is a view illustrating a configuration of a chip enable command in the first embodiment.

In general, according to one embodiment, there is provided a memory system including a controller, a plurality of memory chips, and a channel. The controller outputs a clock signal, a timing control signal and a data signal. Each of the plurality of memory chips includes at least a clock input terminal, a timing control input terminal, a timing control output terminal, a data input terminal and a data output terminal. The channel includes a loop bus which connects the controller and the plurality of memory chips in a ring shape. The controller is able to control operation timings of the memory chips by transmitting the clock signal and the timing control signal to the plurality of memory chips via the channel.

Exemplary embodiments of a memory system will be explained below in detail with reference to the accompanying drawings. The present invention is not limited to the following embodiments.

FIRST EMBODIMENT

A memory system according to a first embodiment includes a controller and a memory chip. In the memory system, a signal is transmitted from the controller to the memory chip via a channel. The memory system can be constituted to comply with low-speed serial interface standards such as a serial peripheral interface (SPI) standards. The low-speed interface standards are assumed to provide a form which can achieve a smaller size of a package and can achieve a smaller number of pins to a master and a slave which can sufficiently exert functions in low-speed communication.

For example, by applying the SPI standards to a controller and a memory chip such as NAND flash memory, an SPI_NAND memory system with the smaller number of bus wirings can be constituted. The SPI_NAND memory system has specifications assuming that the memory system is mainly used for storing a boot code, or the like, in place of NOR flash memory. In the SPI_NAND memory system, the controller serves as a master, and the memory chip serves as a slave.

In the low-speed serial interface standards, a system clock and a timing control signal are supplied from the master to the slave. The slave is put into a valid state in which the slave can operate at a timing at which the timing control signal becomes an active level in synchronization with the system clock. This enables the master to control an operation timing of the slave.

In the memory system, the number of chips which can be directly connected to one channel can be limited to one in accordance with the low-speed serial interface standards such as SPI standards. Thus, if channels corresponding to the number of chips which are desired to be added are additionally provided at the controller to increase memory capacity, there is a possibility that implementation cost may substantially increase. For example, there is a case where it is desired to construct a backup mechanism in case of occurrence of a read error with a plurality of memory chip in a situation where only a single memory chip is implemented, and a boot code is stored. In this case, addition of a plurality of channels at the controller substantially changes a hardware configuration of the controller, which can substantially increase implementation cost.

Further, if the number of channels which can be added is limited to satisfy required implementation cost, the number of chips which can be added is limited to the number of channels, which makes it difficult to expand memory capacity. For example, in a case where a problem that a boot code cannot be stored in one memory chip occurs during system development, such a memory system lacks scalability and has difficulty in flexibly addressing the problem.

Thus, in the present embodiment, the controller and the plurality of memory chips are connected in a ring shape with a loop bus in the memory system. The controller is constituted so as to be able to control operation timings of the respective memory chips by sequentially transmitting the system clock and the timing control signal to the plurality of memory chips via the loop bus. This can achieve both prevention of increase in implementation cost and improvement in scalability of memory capacity.

Specifically, a memory system 1 can be constituted as illustrated in FIG. 1. FIG. 1 is a view illustrating a configuration of the memory system 1. The memory system 1 includes a controller 2, a plurality of memory chips 3-1 to 3-4, and a channel CH.

The controller 2 includes output terminals 2a to 2c, an output terminal group 2g, and input terminals 2d to 2f. Each of the memory chips 3-1 to 3-4 includes input terminals 3a to 3c, an input terminal group 3g, and output terminals 3d to 3f. The respective output terminals and the respective input terminals can be constituted in accordance with the low-speed serial interface standards such as the SPI. The channel CH includes a loop bus LB and a parallel bus PB.

The loop bus LB connects the controller 2 and the plurality of memory chips 3-1 to 3-4 in a ring shape. While an example of a case is illustrated in FIG. 1 where four memory chips 3 are connected in a ring shape with the loop bus LB, the number of memory chips 3 connected in a ring shape with the loop bus LB may be two, three or five or more. The loop bus LB includes a plurality of signal lines SL1 to SL3.

The signal line SL1 extends from the output terminal 2a of the controller 2 and returns to the input terminal 2d of the controller 2 by way of the input terminal 3a and the output terminal 3d of the memory chip 3-1, the input terminal 3a and the output terminal 3d of the memory chip 3-2, the input terminal 3a and the output terminal 3d of the memory chip 3-3, and the input terminal 3a and the output terminal 3d of the memory chip 3-4.

The signal line SL1 sequentially transmits a serial data signal output from the controller 2 to the memory chips 3-1, 3-2, 3-3 and 3-4 and returns the serial data signal to the controller 2. The serial data signal is, for example, a data signal in a serial format. A serial data signal output from the output terminal 2a of the controller 2 and the output terminal 3d of each memory chip 3 will be referred to as serial data output SO, and a serial data signal input to the input terminal 3a of each memory chip 3 and the input terminal 2d of the controller 2 will be referred to as serial data input SI.

The signal line SL2 extends from the output terminal 2b of the controller 2 and returns to the input terminal 2e of the controller 2 by way of the input terminal 3b and the output terminal 3e of the memory chip 3-1, the input terminal 3b and the output terminal 3e of the memory chip 3-2, the input terminal 3b and the output terminal 3e of the memory chip 3-3, and the input terminal 3b and the output terminal 3e of the memory chip 3-4.

The signal line SL2 sequentially transmits a chip select signal output from the controller 2 to the memory chips 3-1, 3-2, 3-3 and 3-4 and returns the chip select signal to the controller 2. The chip select signal, which is a low active timing control signal, makes the memory chip 3 which is an output destination valid at a timing at which the timing control signal becomes a low level. A chip select signal output from the output terminal 2b of the controller 2 and the output terminal 3e of each memory chip 3 will be referred to as chip select output/CSO, and a chip select signal input to the input terminal 3b of each memory chip 3 and the input terminal 2e of the controller 2 will be referred to as chip select input/CSI.

The signal line SL3 extends from the output terminal 2c of the controller 2 and returns to the input terminal 2e of the controller 2 by way of the input terminal 3c and the output terminal 3f of the memory chip 3-1, the input terminal 3c and the output terminal 3f of the memory chip 3-2, the input terminal 3c and the output terminal 3f of the memory chip 3-3, and the input terminal 3c and the output terminal 3f of the memory chip 3-4.

The signal line SL3 sequentially transmits a system clock signal output from the controller 2 to the memory chips 3-1, 3-2, 3-3 and 3-4 and returns the system clock signal to the controller 2. The system clock signal becomes a clock signal which is to be used at the memory chip 3 of the output destination. A system clock signal output from the output terminal 2c of the controller 2 and the output terminal 3f of each memory chip 3 will be referred to as system clock output SCKO, and a system clock signal input to the input terminal 3c of each memory chip 3 and the input terminal 2f of the controller 2 will be referred to as system clock input SCKI.

The parallel bus PB connects the plurality of memory chips 3-1 to 3-4 in parallel to the controller 2. While an example of a case is illustrated in FIG. 1 where four memory chips 3 are connected in parallel with the parallel bus PB, the number of memory chips 3 connected in parallel with the parallel bus PB may be two, three, or five or more. The parallel bus PB includes a plurality of signal lines SL4 and SL5.

The signal lines SL4 and SL5 each extend from the output terminal group 2g of the controller 2 to the input terminal group 3g of the memory chip 3-1, the input terminal group 3g of the memory chip 3-2, the input terminal group 3g of the memory chip 3-3, and the input terminal group 3g of the memory chip 3-4.

The signal line SL4 transmits a write protect signal output from the controller 2 to the plurality of memory chips 3-1 to 3-4 in parallel. The write protect signal, which is a low active signal, is put into a low level in a case where settings of prohibiting writing in the memory chip 3 of the output destination are made.

The signal line SL5 transmits a hold signal output from the controller 2 to the plurality of memory chips 3-1 to 3-4 in parallel. The hold signal, which is a low active signal, is put into a low level in a case where communication between the controller 2 and the memory chip 3 of the output destination is temporarily suspended.

In the memory system 1, the controller 2 and each memory chip 3 are connected via the loop bus LB, so that it is possible to expand the number of chips which can be connected to one channel CH while complying with the low-speed serial interface standards such as the SPI. This can avoid substantial change in a hardware configuration of the controller 2, so that it is possible to prevent increase in implementation cost. Further, the controller 2 can perform processing on a signal without any problem if the controller 2 grasps latency corresponding to (latency of one chip)×(the number of chips) for a period from when a signal is output until when the signal returns via the loop bus LB.

For example, the controller 2 can control operation timings of the memory chip 3 by sequentially transmitting the system clock signal and the chip select signal (timing control signal) to the plurality of memory chips 3-1 to 3-4 through the loop bus LB. The system clock signal and the chip select signal comply with the low-speed serial interface standards such as the SPI.

Note that each memory chip 3 does not include a ready busy (R/B) terminal. The controller 2 sequentially transmits a status read command including designation of a predetermined memory chip 3 to the plurality of memory chips 3-1 to 3-4 by way of the signal line SL1. In a case where the memory chip 3 receives the status read command including designation of the own chip, the memory chip 3 generates and outputs a response indicating an R/B state of the own chip regardless of whether or not the own chip is enabled. The controller 2 can detect the R/B state of the memory chip 3 by receiving the response from the memory chip 3 via the signal line SL1.

Further, the controller 2 can designate the memory chip 3 to be accessed among the plurality of memory chips 3-1 to 3-4 by sequentially transmitting a chip enable command CM16 to the plurality of memory chips 3-1 to 3-4 through the loop bus LB. The chip enable command CM16 can be constituted so as to comply with the low-speed serial interface standards such as the SPI.

A command sequence which complies with the low-speed serial interface standards such as the SPI basically includes a command portion CMD, an address portion ADD and a data portion DT from the head. The data portion DT may be omitted or the address portion ADD and the data portion DT may be omitted depending on commands. Further, a dummy portion DM may be included between the command portion CMD and the address portion ADD or at the address portion ADD and the data portion DT depending on commands.

The command portion CMD includes an identifier of the command. The address portion ADD includes an address indicating an access position at the output destination. The data portion DT includes data to be processed with the command. The dummy portion DM is provided to adjust a timing of the output destination.

For example, each memory chip 3 can execute a plurality of commands CM1 to CM15 illustrated in FIG. 2. FIG. 2 is a view illustrating a configuration of the commands CM1 to CM15 and illustrates a command sequence. Respective commands CM1 to CM15 comply with the low-speed serial interface standards such as the SPI. Byte1 of each of the commands CM1 to CM15 indicates the command portion CMD. A portion after Byte2 can differ for each command. "Dummy" indicates the dummy portion DM, and "A (number)" indicates the address portion ADD, and "D (number)", "D*" or "ID" indicates the data portion DT.

The chip enable command CM16 is added as a command which can be executed by each memory chip 3. A command sequence of the chip enable command CM16 includes, for example, the command portion CMD and the data portion DT as illustrated in FIG. 3. FIG. 3 is a view illustrating a configuration of the chip enable command CM16. The command portion CMD includes a CE_SET_CMD identifier. The CE_SET_CMD identifier indicates that the command is the chip enable command, and includes a bit pattern, for example, corresponding to FC in hexadecimal notation. The data portion DT includes information /CE[3:0] which designates the memory chip 3 to be enabled. The information /CE[3:0] is low active (0 active) information.

For example, in a case where the controller 2 selectively accesses the memory chip 3-2 among the plurality of memory chips 3-1 to 3-4, the controller 2 generates the chip enable command CM16 including a bit pattern of /CE[3:0] =1101b. The controller 2 outputs the chip enable command CM16 to the signal line SL1 of the loop bus LB from the output terminal 2a, and then, outputs a write command and/or a read command to the signal line SL1 of the loop bus LB. The chip enable command CM16 is sequentially transmitted to the plurality of memory chips 3-1 to 3-4 via the signal line SL1 of the loop bus LB, and subsequently, the write command and/or the read command are sequentially transmitted to the plurality of memory chips 3-1 to 3-4 via the signal line SL1 of the loop bus LB. This enables the controller 2 to selectively access at least one memory chip 3 among the plurality of memory chips 3-1 to 3-4 via the signal line SL1 of the loop bus LB so that at least one of write or read of data is caused to be performed.

Figure 4:
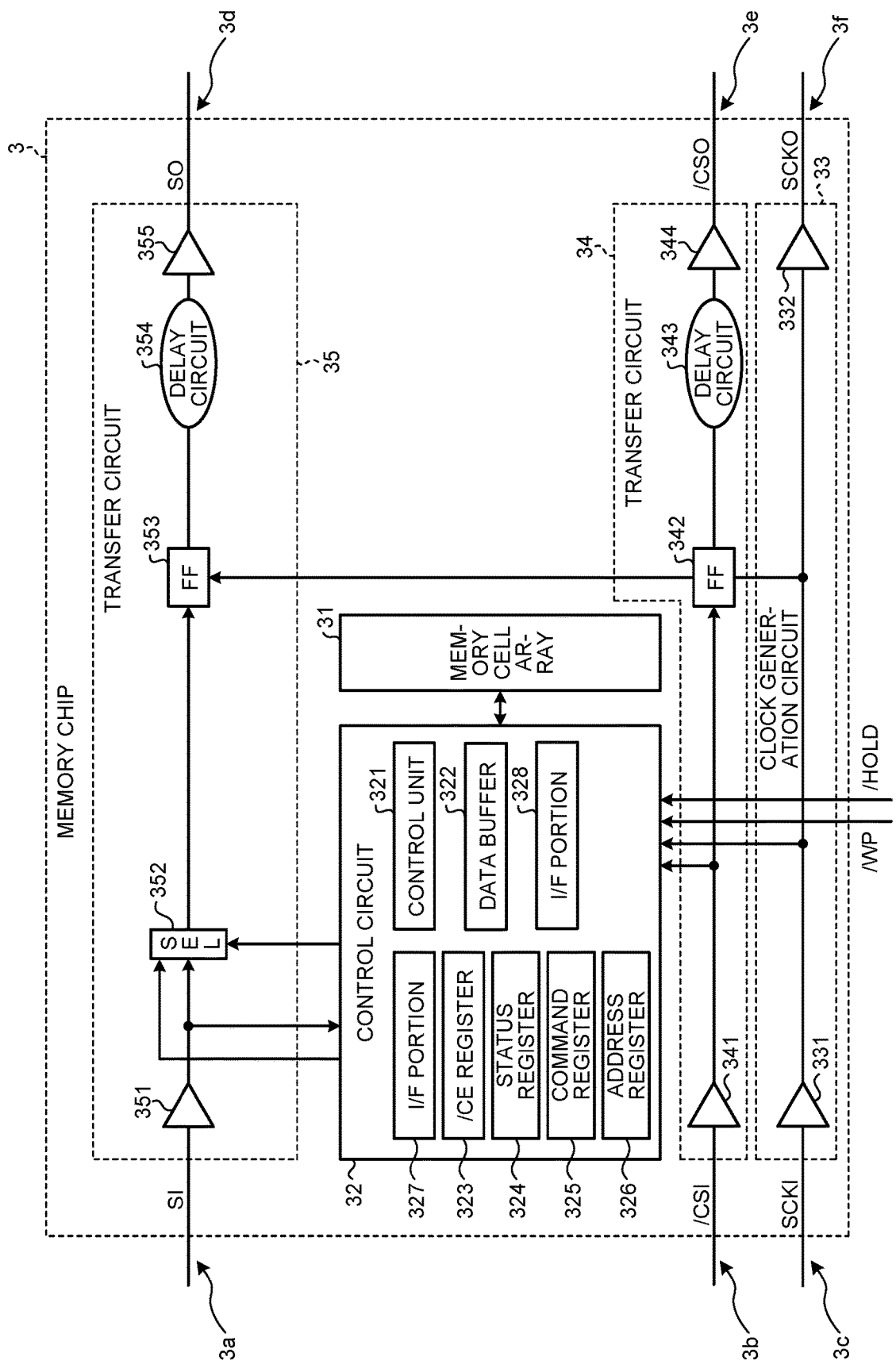
FIG. 4 is a view illustrating a configuration of a memory chip in the first embodiment.

Further, each memory chip 3 has a configuration corresponding to the loop bus LB and further has a configuration corresponding to the chip enable command CM16. Each memory chip 3 can be constituted as illustrated in FIG. 4. FIG. 4 is a view illustrating a configuration of each memory chip 3.

Each memory chip 3 includes a memory cell array 31, a control circuit 32, a clock generation circuit 33, a transfer circuit 34, and a transfer circuit 35.

A plurality of memory cells is arranged in the memory cell array 31. Each memory cell is a non-volatile memory cell, and is, for example, a NAND flash memory cell. The plurality of memory cells is arranged in two dimensions so as to constitute a plurality of rows and a plurality of columns, which are respectively associated with row addresses and column addresses. Memory cells in the same row are connected to the same word line, and memory cells in the same column are connected to the same bit line. Data is read out and written in page unit. Further, data is erased in block unit. One memory cell group including a plurality of memory cells connected to the same word line corresponds to n (where n is an integer equal to or greater than 1) pages. A plurality of memory cell groups corresponds to a block.

The control circuit 32 comprehensively controls respective components of the memory chip 3. The control circuit 32 includes a control unit 321, a data buffer 322, a /CE register 323, a status register 324, a command register 325, an address register 326, an interface (I/F) portion 327, and an interface (I/F) portion 328.

The clock generation circuit 33 is electrically connected among the input terminal 3c, the control circuit 32, the transfer circuit 34, the transfer circuit 35 and the output terminal 3f. The clock generation circuit 33 receives a system clock signal transmitted via the input terminal 3c and generates a system clock signal in accordance with the transmitted system clock signal. The clock generation circuit 33 buffers the system clock signal and generates a system clock signal to which a delay in accordance with a buffering period is added. The clock generation circuit 33 supplies the system clock signal to the control circuit 32, the transfer circuit 34 and the transfer circuit 35. This enables the control circuit 32, the transfer circuit 34 and the transfer circuit 35 to operate in synchronization with the common system clock signal so that operation of the control circuit 32, the transfer circuit 34 and the transfer circuit 35 can be in synchronization with each other. Further, the clock generation circuit 33 further buffers the system clock signal and outputs a system clock signal to which a delay in accordance with a buffering period is further added from the output terminal 3f as a system clock signal SCK.

For example, the clock generation circuit 33 includes a driver 331 and a driver 332. The driver 331 has an input node connected to the input terminal 3c and has an output node connected to the control circuit 32, the transfer circuit 34, the transfer circuit 35, and the driver 332. The driver 332 has an input node connected to the control circuit 32, the transfer circuit 34, the transfer circuit 35 and the driver 331 and has an output node connected to the output terminal 3f.

The driver 331 receives the system clock signal via the input terminal 3c, drives and buffers the system clock signal, and generates a system clock signal to which a delay in accordance with a buffering period is added. This enables the driver 331 to generate a system clock signal by shaping a waveform and adjusting a timing of the received system clock signal. The driver 331 supplies the generated system clock signal to the control circuit 32, the transfer circuit 34, the transfer circuit 35 and the driver 332. This enables the control circuit 32, the transfer circuit 34 and the transfer circuit 35 to operate in synchronization with the common system clock signal, so that operation of the control circuit 32, the transfer circuit 34 and the transfer circuit 35 can be in synchronization with each other.

The driver 332 receives the system clock signal from the driver 331, further buffers the system clock signal and generates a system clock signal to which a delay in accordance with a buffering period is further added. The driver 332 outputs the generated system clock signal from the output terminal 3f.

The transfer circuit 34 transfers the chip select signal /CS input via the input terminal 3b to a side of the output terminal 3e in synchronization with the clock signal generated at the clock generation circuit 33. The transfer circuit 34 includes a driver 341, a flip-flop 342, a delay circuit 343 and a driver 344.

The driver 341 has an input node connected to the input terminal 3b and has an output node connected to the control circuit 32 and the flip-flop 342. The flip-flop 342 has a data input terminal connected to the driver 341, has a clock input terminal connected to the driver 331 of the clock generation circuit 33 and has a data output terminal connected to the delay circuit 343. The delay circuit 343 has one end connected to the flip-flop 342 and has the other end connected to the driver 344. The driver 344 has an input node connected to the delay circuit 343 and has an output node connected to the output terminal 3e.

The driver 341 receives the chip select signal via the input terminal 3b and drives and transfers the chip select signal to the control circuit 32 and the flip-flop 342.

In a case where the chip select signal is received from the driver 341 via the I/F portion 328 at the control circuit 32, an operation timing of the control unit 321 can be controlled in accordance with a level of the chip select signal. The control unit 321 recognizes that it is not a timing at which the control unit 321 can operate if the chip select signal is in a non-active level (for example, an H level). As a result of this, the control unit 321 does not perform processing even if the control unit 321 receives a command regardless of whether or not the own chip is enabled. The control unit 321 recognizes that it is a timing at which the control unit 321 can operate if the chip select signal is in an active level (for example, an L level). As a result of this, in a case where the control unit 321 receives a command, the control unit 321 processes the command if the own chip is enabled.

The flip-flop 342 receives the chip select signal from the driver 331 and receives the system clock signal from the clock generation circuit 33. The flip-flop 342 transfers the chip select signal to the driver 344 by way of the delay circuit 343 in synchronization with the system clock signal. The delay circuit 343 has a delay amount for adjusting a difference in an internal transmission delay with the clock generation circuit 33, and the driver 344 receives a chip select signal to which the delay amount is provided. This enables a timing at which the driver 332 receives the system clock signal to be substantially in synchronization with a timing at which the driver 344 receives the chip select signal. The driver 344 drives and outputs the chip select signal from the output terminal 3e.

The transfer circuit 35 transfers the data signal S input via the input terminal 3a to a side of the output terminal 3d in synchronization with the clock signal generated at the clock generation circuit 33. The transfer circuit 35 includes a driver 351, a selector 352, a flip-flop 353, a delay circuit 354 and a driver 355.

The driver 351 has an input node connected to the input terminal 3a and has an output node connected to the control circuit 32 and the selector 352. The selector 352 has a first input node connected to the driver 351, has a second input node connected to the control circuit 32, has a select node connected to the control circuit 32 and has an output node connected to the flip-flop 353. The flip-flop 353 has a data input terminal connected to the selector 352, has a clock input terminal connected to the driver 331 of the clock generation circuit 33 and has a data output terminal connected to the delay circuit 354. The delay circuit 354 has one end connected to the flip-flop 353 and has the other end connected to the driver 355. The driver 355 has an input node connected to the delay circuit 354 and has an output node connected to the output terminal 3d.

The driver 351 receives a data signal via the input terminal 3a and drives and transfers the data signal to the control circuit 32 and the selector 352. In a case where the chip enable command CM16 is received at the control circuit 32 as the data signal by way of the I/F portion 327, the control unit 321 stores information /CE[3:0] included in the data portion DT in the /CE register 323. In a case where other commands CM are received as the data signal, the control unit 321 stores the command portion CMD in the command register 325, stores the address portion ADD in the address register 326 and stores the data portion DT in the data buffer 322.

At the control circuit 32, the control unit 321 refers to the information /CE[3:0] stored in the /CE register 323 and in a case where the control unit 321 determines that the own chip is disabled in accordance with the information /CE[3:0], the control unit 321 generates a select signal which selects the first input node and supplies the select signal to the select node of the selector 352. In this event, the data signal from the driver 351 is supplied to the first input node of the selector 352.

The control unit 321 refers to the information /CE[3:0] stored in the /CE register 323 and in a case where the control unit 321 determines that the own chip is enabled in accordance with the information /CE[3:0], the control unit 321 generates a select signal which selects the second input node and supplies the select signal to the select node of the selector 352. Along with that, the control unit 321 acquires the data signal from the data buffer 322 in a case where the data signal to be transferred exists in the data buffer 322 and transfers the data signal to the second input node of the selector 352.

The selector 352 further transfers the data signal transferred from the driver 351 or the control circuit 32 to the flip-flop 353. The flip-flop 353 receives the data signal from the selector 352 and receives the system clock signal from the clock generation circuit 33. The flip-flop 353 transfers the data signal to the driver 355 by way of the delay circuit 354 in synchronization with the system clock signal. The delay circuit 354 has a delay amount for adjusting a difference in an internal transmission delay with the clock generation circuit 33, and the driver 355 receives a data signal to which the delay amount is provided. This enables a timing at which the driver 332 receives the system clock signal to be substantially in synchronization with a timing at which the driver 355 receives the data signal. The driver 355 drives and outputs the data signal from the output terminal 3d.

Figure 5:
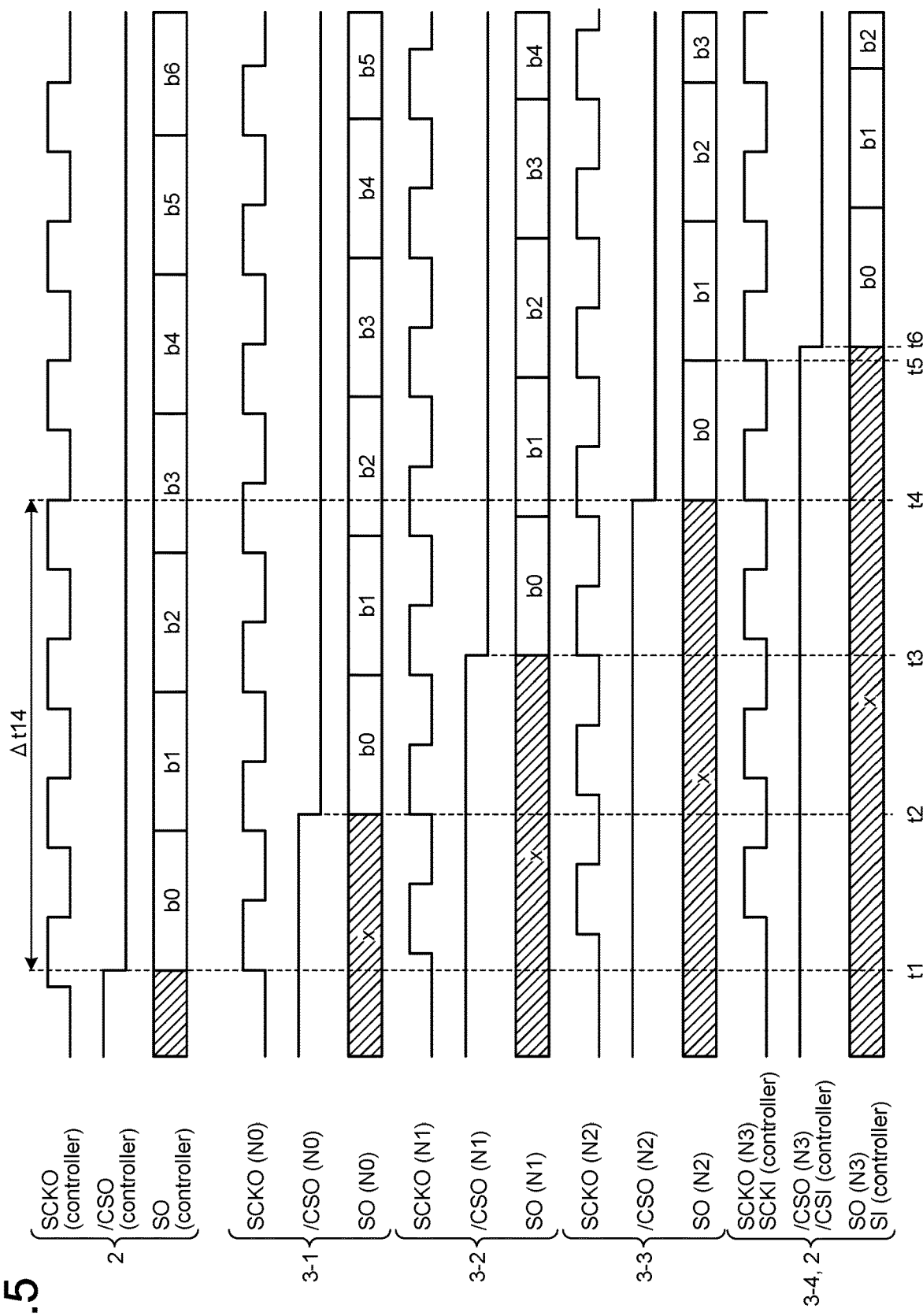
FIG. 5 is a waveform diagram illustrating operation of the memory system according to the first embodiment.

Operation of the memory system 1 will be described next using FIG. 5. FIG. 5 is a waveform diagram illustrating the operation of the memory system 1.

The controller 2 outputs the system clock signal SCK from the output terminal 2c to the signal line SL3 prior to a timing t1, and the system clock signal SCK is sequentially transmitted to the plurality of memory chips 3-1 to 3-4. For example, in a case where it is desired to selectively access the memory chip 3-2 to cause a predetermined command to be executed, the controller 2 sequentially transmits a status read command including designation of a chip of the memory chip 3-2 to the plurality of memory chips 3-1 to 3-4 by way of the signal line SL1. In a case where the controller 2 detects that the memory chip 3-2 is in a ready (R) state, the controller 2 sequentially transmits the chip enable command CM1 including information of "/CF[3:0]=1101b" to the respective memory chips 3-1 to 3-4 by way of the signal line SL1. The information of "/CE[3:0]=1101b" indicates that the memory chip 3-2 is selectively enabled. The information of "/CE[3:0]=1101b" is stored in the /CE register 323 of each of the memory chips 3-1 to 3-4.

Note that edge timings of the system clock signals SCK output from the output terminal 2c of the controller 2 and the output terminals 3e of the respective memory chips 3-1 to 3-4 are displaced from each other. Also in this case, signals can be appropriately transferred within the respective memory chips 3-1 to 3-4 with the buffered common system clock signal SCK.

Further, it is assumed that a transmission delay by the signal line SL can be ignored, and a transmission delay in the loop bus LB is practically dominated by a delay in association with signal transfer within the respective memory chips 3-1 to 3-4.

At a timing t1, the controller 2 causes a level of the chip select signal CS output from the output terminal 2b to the signal line SL2 to transition from a non-active level (for example, an H level) to an active level (for example, an L level) and starts output of a data signal b0 from the output terminal 2a to the signal line SL1. In accordance with this, the memory chip 3-1 is put into a valid state as a result of a level of the chip select signal CS received at the input terminal 3b via the signal line SL2 transitioning from a non-active level to an active level. In a case where the memory chip 3-1 is put into a valid state, the memory chip 3-1 confirms the information /CE[3:0] stored in the /CE register 323. The memory chip 3-1 allows the data signal b0 to pass (that is, internally transfer the data signal b0 as is) without performing processing on the data signal b0 in accordance with a fact that the own chip is not enabled on the basis of the information /CE[3:0]=1101b.

At a timing t2, the memory chip 3-1 causes a level of the chip select signal CS output from the output terminal 3e to the signal line SL2 to transition from a non-active level (for example, an H level) to an active level (for example, an L level) and starts output of a data signal b0 from the output terminal 3d to the signal line SL1. In accordance with this, the memory chip 3-2 is put into a valid state as a result of a level of the chip select signal CS received at the input terminal 3b via the signal line SL2 transitioning from a non-active level to an active level. In a case where the memory chip 3-2 is put into a valid state, the memory chip 3-2 confirms the information /CE[3:0] stored in the /CE register 323. The memory chip 3-2 allows the data signal b0 to pass (that is, internally transfer the data signal b0 as is) without performing processing on the data signal b0 in accordance with a fact that the own chip is not enabled on the basis of the information /CE[3:0]=1101b.

At a timing t3, the memory chip 3-2 causes a level of the chip select signal CS output from the output terminal 3e to the signal line SL2 to transition from a non-active level (for example, an H level) to an active level (for example, an L level) and starts output of a data signal b0 from the output terminal 3d to the signal line SL1. In accordance with this, the memory chip 3-3 is put into a valid state as a result of a level of the chip select signal CS received at the input terminal 3b via the signal line SL2 transitioning from a non-active level to an active level. In a case where the memory chip 3-3 is put into a valid state, the memory chip 3-3 confirms the information /CE[3:0] stored in the /CE register 323. The memory chip 3-3 processes the data signal b0 in accordance with a fact that the own chip is enabled on the basis of the information /CE[3:0]=1101b. The memory chip 3-3 processes the data signal b0 in synchronization with the system clock SCK generated (for example, buffered) at the clock generation circuit 33.

For example, in a case where the data signal b0 is a read command, data is read from the memory cell array 31 in accordance with the read command, and the data signal b1 is set as read data. In a case where the data signal b0 is a write command, data is written in the memory cell array 31 in accordance with the write command, and if writing is completed, the data signal b1 is set as a write completion notification.

At a timing t4, the memory chip 3-3 causes a level of the chip select signal CS output from the output terminal 3e to the signal line SL2 to transition from a non-active level (for example, an H level) to an active level (for example, an L level) and starts output of a data signal b0 from the output terminal 3d to the signal line SL1. In accordance with this, the memory chip 3-4 is put into a valid state as a result of a level of the chip select signal CS received at the input terminal 3b via the signal line SL2 transitioning from a non-active level to an active level. In a case where the memory chip 3-4 is put into a valid state, the memory chip 3-4 confirms the information /CE[3:0] stored in the /CE register 323. The memory chip 3-4 allows the data signal b0 to pass (that is, internally transfer the data signal b0 as is) without performing processing on the data signal b0 in accordance with a fact that the own chip is not enabled on the basis of the information /CE[3:0]=1101b.

At a timing t5, the memory chip 3-3 completes output of the data signal b0 from the output terminal 3d to the signal line SL1 and starts output of the next data signal b1 from the output terminal 3d to the signal line SL1.

At a timing t6, the memory chip 3-4 causes a level of the chip select signal CS output from the output terminal 3e to the signal line SL2 to transition from a non-active level (for example, an H level) to an active level (for example, an L level) and starts output of a data signal b0 from the output terminal 3d to the signal line SL1. In accordance with this, in the controller 2, a level of the chip select signal CS received at the input terminal 2e via the signal line SL2 transitions from a non-active level to an active level.

Here, a time period $\Delta t_L$ from when the controller 2 outputs the chip select signal CS until when the chip select signal CS returns and is input corresponds to the number of chips N which are connected in a ring shape with the loop bus LB. It is assumed that reference latency $\Delta t_{cs}$ of one chip and the number of chips N connected in a ring shape are set at the controller 2. In a case where an absolute value of an allowable error is set at $\Delta tm$ (>0), the controller 2 can determine that the chip select signal CS can be appropriately transmitted/received at each memory chip 3 in a case where the following expression 1 is satisfied.

$$\Delta t_{cs} \times N - \Delta tm \leq \Delta t_L \leq \Delta t_{cs} \times N + \Delta tm \qquad \text{expression 1}$$

FIG. 5 illustrates an example of a case where N=4, and $\Delta t_L = \Delta t14$.

Note that the controller 2 can also determine whether or not other signals (for example, the data signal and the system clock signal, and so on) can be appropriately transmitted/received at each memory chips 3 by grasping a value of (latency corresponding to one chip)×(the number of chips) in a similar manner.

For example, the controller 2 can implement timing control for each memory chip 3 in a similar manner to expression 1 for commands which do not read data from the memory cell array 31, such as write commands and erase commands among the plurality of commands CM1 to CM15 illustrated in FIG. 2.

Meanwhile, the controller 2 side needs to slightly change timing control for commands, or the like, (such as buffer read commands CM2 to CM4 and a status read command) which relate to read of data from the memory cell array 31. The NANDC receives input of the read data by way of SO of the last chip N3 of the DC. In this event, the NANDC cares for system clock output SCKO and a chip select output /CSO signal output by the last memory chip (N3)3-4 connected in a ring shape. In other words, the NANDC accurately imports data by detecting data content of the data output SO output by the last memory chip (N3)3-4 in synchronization with the system clock output SCKO and the chip select output /CSO signal. For example, the controller 2 can accurately import the data signal by detecting a head bit position of Byte4 which is a "Dummy" byte in the buffer read commands CM2 to CM4 illustrated in FIG. 2 or a head bit position of Byte5 which is a data "D*-D*" byte. This mechanism enables the controller 2 to load the read data without regard to the number of memory chips even if an arbitrary number of memory chips 3 are connected to the loop bus LB in a ring shape.

As described above, in the first embodiment, the controller 2 and the plurality of memory chips 3-1 to 3-4 are connected in ring shape with the loop bus LB in the memory system 1. The controller 2 can control operation timings of the respective memory chips 3 by sequentially transmitting the system clock signal and the chip select signal to the plurality of memory chips 3-1 to 3-4 by way of the loop bus LB. This can make the number of chips which can be connected to one channel variable while complying with the low-speed serial interface standards such as the SPI standards, so that it is possible to make the configuration of the memory system 1 scalable. As a result, it is possible to prevent increase in implementation cost of the memory system 1 and improve scalability of memory capacity of the memory system 1.

Note that while FIG. 1 illustrates an example where four chips are connected in a ring shape in the memory system 1, the number of chips connected in a ring shape may be two, three or five or more. For example, the number of chips which are to be connected in a ring shape may be from 5 to 16 in accordance with a maximum number of chips of 16 which can be enabled with the information /CE[3:0] of the data portion DT of the chip enable command CM16. Alternatively, for example, the number of chips which are to be connected in a ring shape may be equal to or less than $2^N$ if the number of bits of the information /CE of the data portion DT of the chip enable command CM16 is increased to N (N>4).

Alternatively, the plurality of memory chips 3 may be collectively accessed. The controller 2 generates the chip enable command CM16 including a bit pattern of /CE[3:0]=0000b in a case where the controller 2 collectively accesses the plurality of memory chips 3-1 to 3-4. The information of "/CE[3:0]=0000b" indicates enabling all the memory chips 3-1 to 3-4. In this case, if an issued one command is a command which does not involve output of data to outside of the memory chip 3, the controller 2 can execute the command at all the memory chips 3-1 to 3-4 in parallel. In other words, the controller 2 sequentially transmits the chip enable command CM16 to the plurality of memory chips 3-1 to 3-4 by way of the loop bus LB, enables all the memory chips 3, and then, transmits the chip select signal and a command which is desired to be collectively executed to the plurality of memory chips 3-1 to 3-4. As a result, the respective memory chips 3-1 to 3-4 execute the command in synchronization with the system clock after the chip select signal is put into an active level. Thus, the command can be executed in parallel at all the memory chips 3-1 to 3-4, so that it is possible to easily improve throughput of command processing in the memory system 1.

For example, the controller 2 can cause a read cell array command CM1, a program load command CM5, a program execute command CM6, a protect execute command CM7, a program load random data command CM8, a reset command CM10, a write enable command CM11, a write disable command CM12 and a set feature command CM14 among the plurality of commands CM1 to CM15 illustrated in FIG. 2 to be executed in parallel at all the memory chips 3-1 to 3-4.

SECOND EMBODIMENT

A memory system according to a second embodiment will be described next. A part different from the first embodiment will be mainly described below.

In the first embodiment, while the read buffer commands CM2 to CM4 are executed at each memory chip 3, the next command cannot be executed, which may degrade processing efficiency. For example, there is a possibility that speed of reading out data from the memory cell array 31 may be lowered in a case where a boot code is continuously read out in the memory system 1.

Figure 6:
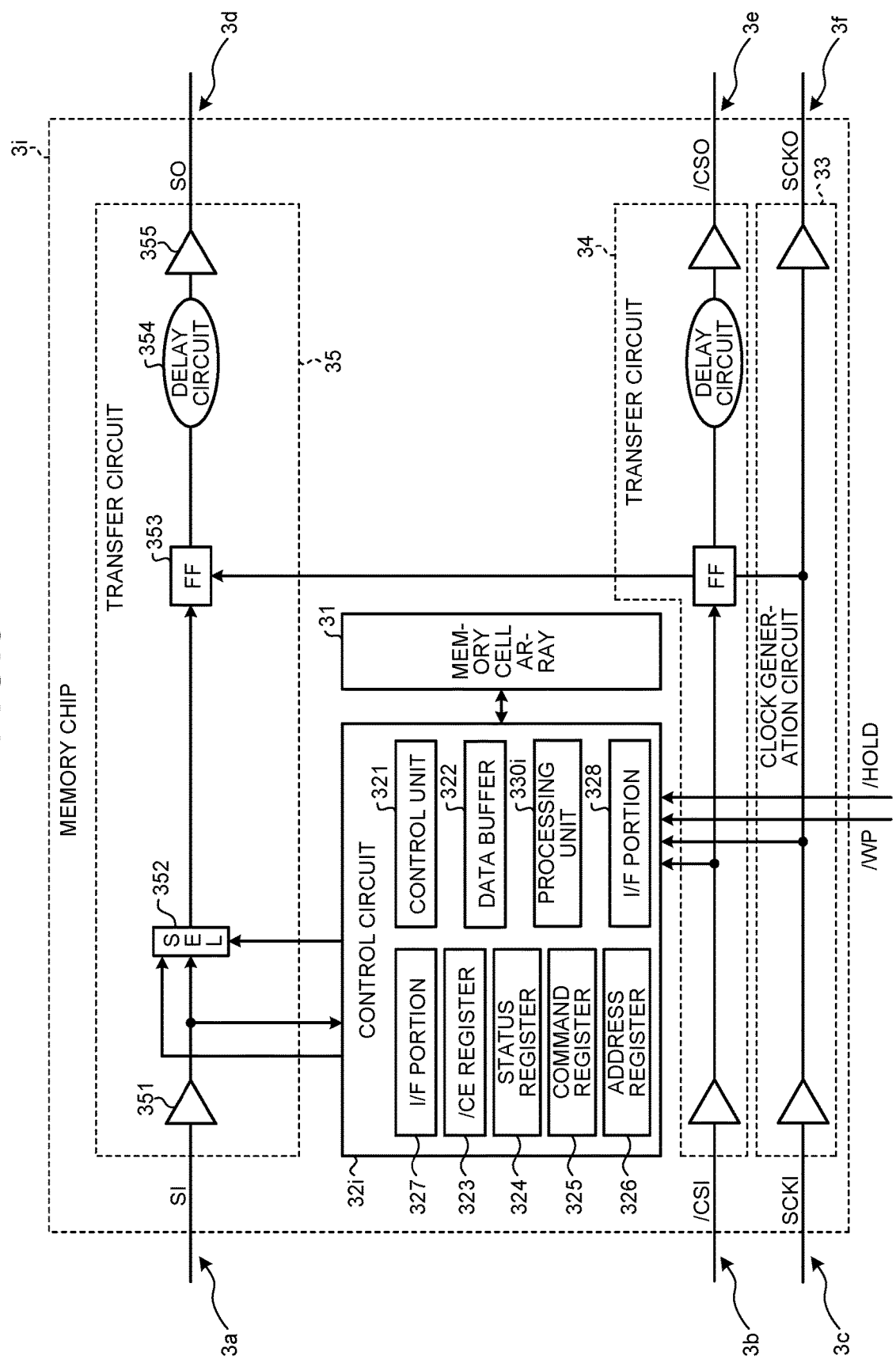
FIG. 6 is a view illustrating a configuration of a memory chip in a second embodiment.

To address this, in the second embodiment, as illustrated in FIG. 6, attention is focused on that the data signal input SI and the data signal output SO are independent in each memory chip 3*i* in a memory system 1*i*, and a processing unit 330*i* which can perform command processing independently of the control unit 321 is provided. The processing unit 330*i* may be state machine dedicated for the read buffer commands CM2 to CM4.

For example, in a case where the processing unit 330*i* receives the read buffer commands CM2 to CM4 by way of the input terminal 3*a*, the driver 351 and the I/F portion 237, the processing unit 330*i* supplies a select signal which selects the second input node to the selector 352. Along with that, the processing unit 330*i* acquires read data from an area secured as a read buffer in the data buffer 322 and transfers the read data to the second input node of the selector 352.

In parallel to processing of the read buffer commands CM2 to CM4 by the processing unit 330*i*, in a case where the control unit 321 receives a command by way of the input terminal 3*a*, the driver 351 and the I/F portion 237, the control unit 321 performs command processing if the command is a command which does not involve output of data to outside of the memory chip 3. For example, the control unit 321 can perform command processing, in parallel to the command processing by the processing unit 330*i*, with respect to a read cell array command CM1, a program load command CM5, a program execute command CM6, a protect execute command CM7, a program load random data command CM8, a reset command CM10, a write enable command CM11, a write disable command CM12 and a set feature command CM14 among the plurality of commands CM1 to CM15 illustrated in FIG. 2.

As described above, in the second embodiment, the following commands can be executed while the read buffer commands CM2 to CM4 are executed at each memory chip 3*i* in the memory system 1*i*. This can improve efficiency of command processing at each memory chip 3*i*.

THIRD EMBODIMENT

A memory system according to a third embodiment will be described next. A part different from the first and second embodiments will be mainly described below.

While an example of a configuration is illustrated in the first embodiment where the memory chip 3 to be enabled is designated with the chip enable command CM16, in the third embodiment, an example of a configuration where a memory chip 3*j* to be enabled is designated with the chip enable signal is illustrated.

Figure 7:
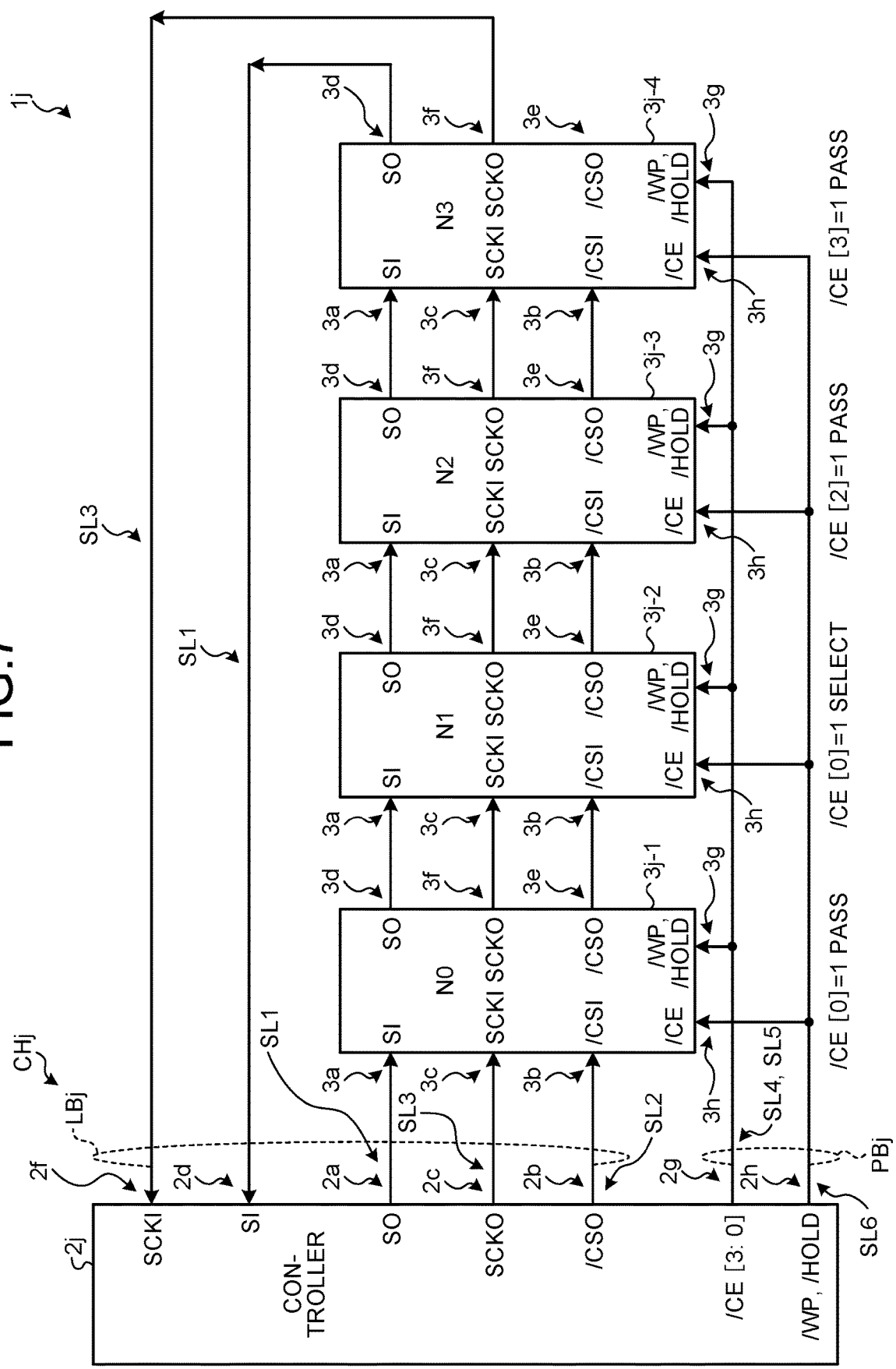
FIG. 7 is a view illustrating a configuration of a memory system according to a third embodiment.

Specifically, a memory system 1*j* can be constituted as illustrated in FIG. 7. FIG. 7 is a view illustrating a configuration of the memory system 1*j*. The memory system 1*j* includes a controller 2*j*, a plurality of memory chips 3*j*-1 to 3*j*-4 and a channel CHj in place of the controller 2, the plurality of memory chips 3-1 to 3-4 and the channel CH (see FIG. 1).

At the controller 2*j*, an output terminal 2*h* is added, and an input terminal 2*e* is omitted. The channel CHj includes a loop bus LBj and a parallel bus PBj.

At the loop bus LBj, the signal line SL2 connects the plurality of memory chips 3*j*-1 to 3*j*-4 in a line shape, and a portion connected from the output terminal 3*e* of the last memory chip 3*j*-4 to the controller 2*j* is omitted.

The parallel bus PBj further includes a signal line SL6. The signal line SL6 extends from the output terminal 2*h* of the controller 2*j* respectively to the input terminal 3*h* of the memory chip 3*j*-1, the input terminal 3*h* of the memory chip 3*j*-2, the input terminal 3*h* of the memory chip 3*j*-3 and the input terminal 3*h* of the memory chip 3*j*-4. The signal line SL6 transmits the chip enable signal output from the controller 2*j* to the plurality of memory chips 3*j*-1 to 3*j*-4 in parallel. The chip enable signal, which is a low active signal, is put into a low level (or 0) in a case where the memory chip 3*j* of the output destination is enabled.

For example, the controller 2*j* outputs the chip enable signal of /CE[3:0]=1101b from the output terminal 2*h* to the signal line SL6 in a case where the memory chip 3*j*-2 is selectively accessed among the plurality of memory chips 3*j*-1 to 3*j*-4.

Figure 8:
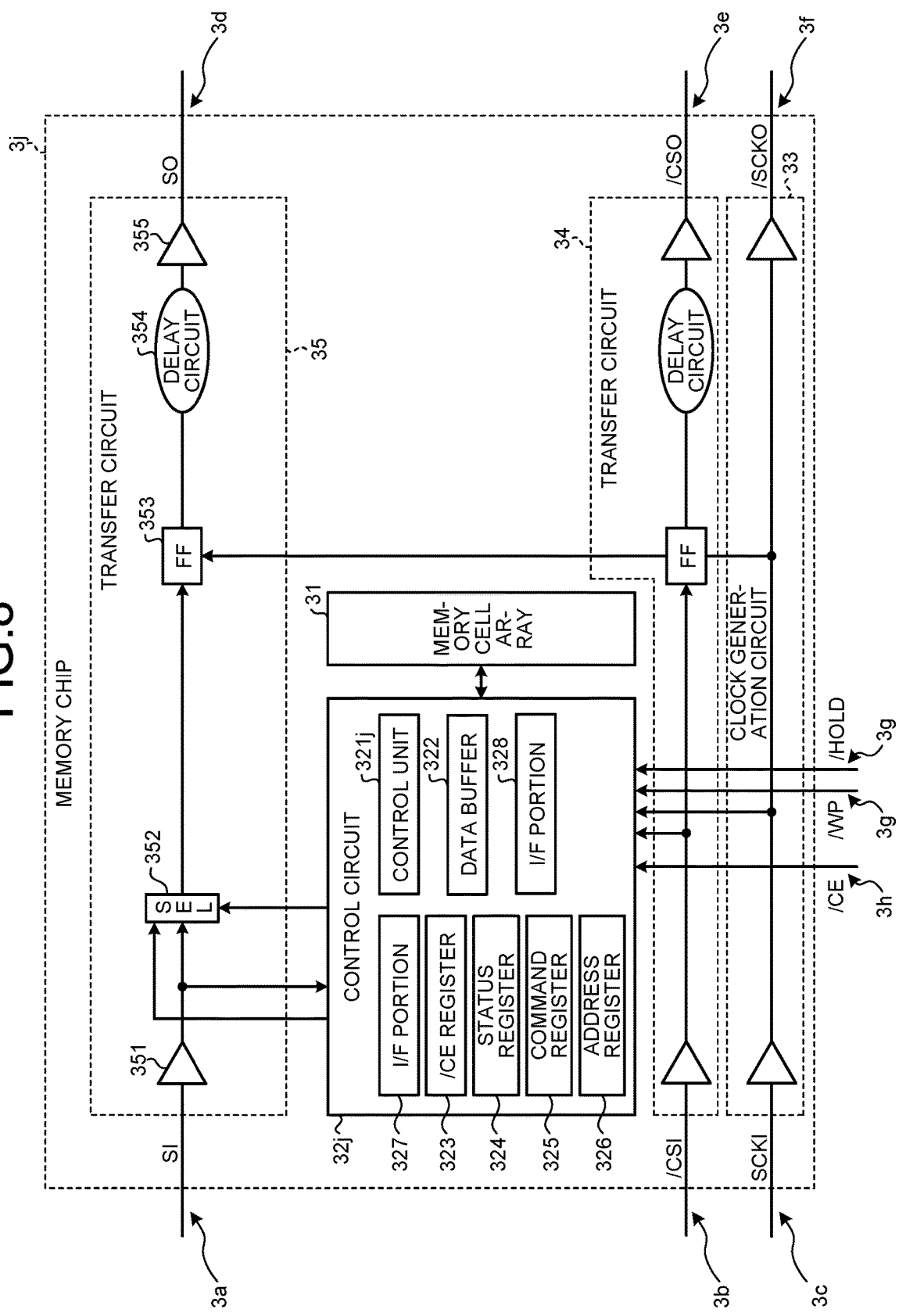
FIG. 8 is a view illustrating a configuration of a memory chip in a third embodiment.

In response to this, at each memory chip 3*j*, as illustrated in FIG. 8, the control unit 321*j* of the control circuit 32*j* receives the chip enable signal /CE from the input terminal 3*h* by way of the I/F portion 328 and stores the chip enable signal /CE in the /CE register 323. FIG. 8 is a view illustrating a configuration of the memory chip 3*j*. The third embodiment is similar to the first embodiment in that in a case where the control circuit 32*j* determines that the own chip is enabled in accordance with the information /CE[3:0] with reference to the information /CE[3:0] stored in the /CE register 323 upon reception of a command, the control circuit 32*j* can execute command processing.

As described above, in the third embodiment, in the memory system 1*j*, the controller 2*j* outputs the chip enable signal which designates the memory chip 3*j* to be enabled to the channel CHj and accesses the designated memory chip 3*j*. This also enables the controller 2*j* to selectively access at least one memory chip 3*j* among the plurality of memory chips 3*j* via the channel CHj so that at least one of write or read of data is caused to be performed.

FOURTH EMBODIMENT

A memory system according to a fourth embodiment will be described next. A part different from the first to third embodiments will be mainly described below.

While in the first embodiment, each memory chip 3 buffers the system clock input SCKI and transmits the buffered system clock input SCKI to the next step as the system clock output SCKO, in a case where timings are designed with a sufficient margin (for example, in a case where a frequency of the system clock signal SCK is low), slight variation in timings can be allowed among the plurality of memory chips 3.

Thus, in the fourth embodiment, an example of a configuration where a controller 2*k* distributes the system clock signal SCK to all memory chips 3*k* in parallel will be described.

Figure 9:
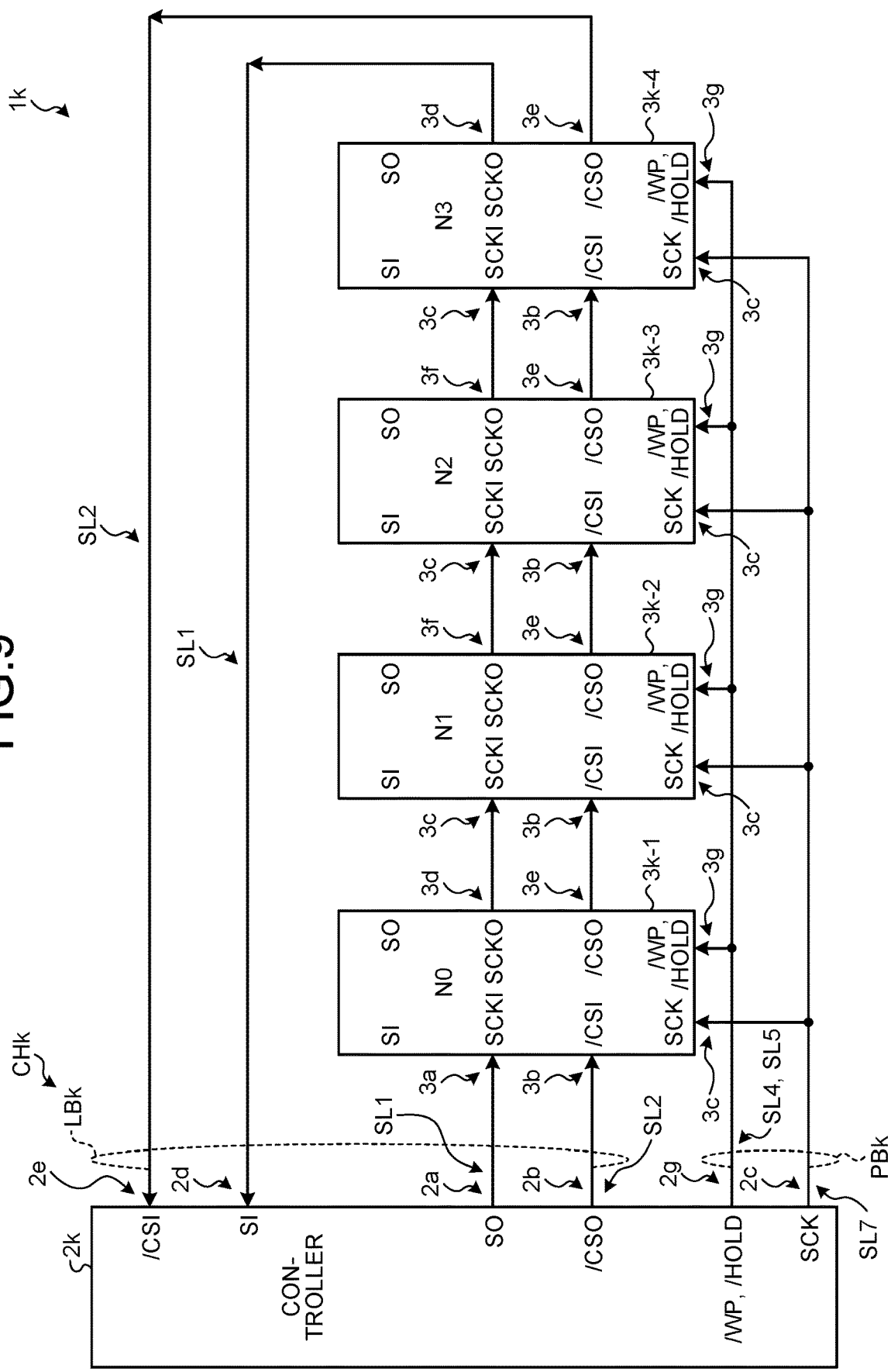
FIG. 9 is a view illustrating a configuration of a memory system according to a fourth embodiment.

Specifically, a memory system 1*k* can be constituted as illustrated in FIG. 9. FIG. 9 is a view illustrating a configuration of the memory system 1*k*. The memory system 1*k* includes a controller 2*k*, a plurality of memory chips 3*k*-1 to 3*k*-4 and a channel CHk in place of the controller 2, the plurality of memory chips 3-1 to 3-4 and the channel CH (see FIG. 1).

The input terminal 2*f* is omitted at the controller 2*k*. The output terminal 3*f* is omitted at each of the memory chip 3*k*-1 to 3*k*-4. The channel CHk includes a loop bus LBk and a parallel bus PBk. The signal line SL3 is omitted at the loop bus LBk. The parallel bus PBk further includes a signal line SL7. The signal line SL7 extends from the output terminal 2*c* of the controller 2*k* to each of the input terminal 3*c* of the memory chip 3*k*-1, the input terminal 3*c* of the memory chip 3*k*-2, the input terminal 3*c* of the memory chip 3*k*-3, and the input terminal 3*c* of the memory chip 3*k*-4. The signal line SL7 transmits the system clock signal SCK output from the controller 2*k* to the plurality of memory chips 3*k*-1 to 3*k*-4 in parallel.

Figure 10:
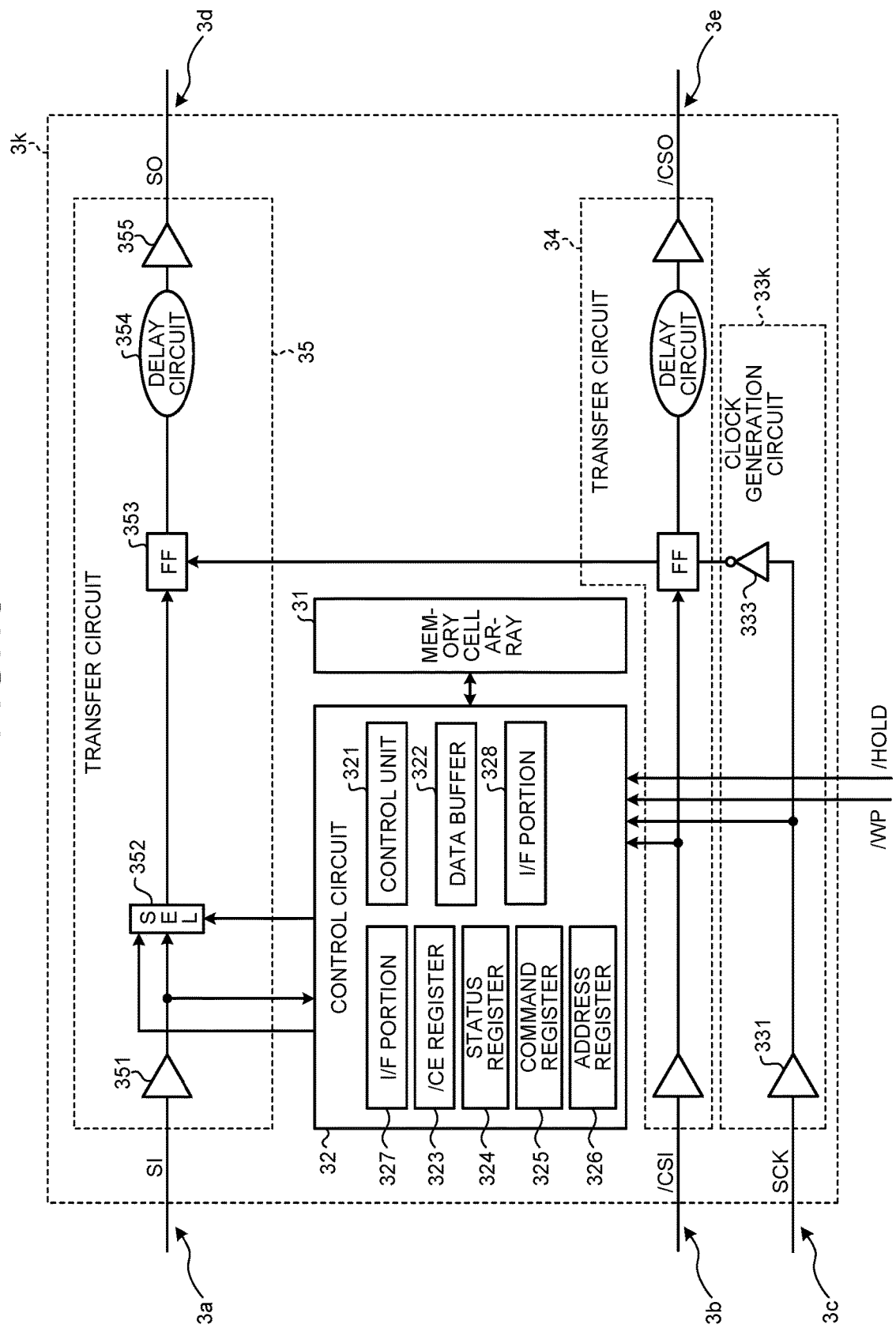
FIG. 10 is a view illustrating a configuration of a memory chip in the fourth embodiment.

In response to this, at each memory chip 3*k*, as illustrated in FIG. 10, the clock generation circuit 33*k* receives the system clock signal SCK from the input terminal 3*c* and generates a system clock signal in accordance with the transmitted system clock signal. FIG. 10 is a view illustrating a configuration of the memory chip 3*k*. The clock generation circuit 33*k* buffers the system clock signal and generates a system clock signal to which a delay in accordance with a buffering period is added and which is logically inverted.

For example, the driver 332 is omitted and an inverter 333 is added at the clock generation circuit 33*k*. The inverter 333 has an input node connected to the driver 331 and has an output node connected to the transfer circuit 34, the transfer circuit 35 and the driver 332. By this means, within the memory chip 3*k*, the data output SO and the chip select output /CSO are transmitted to the next memory chip 3*k* in synchronization with a falling timing of the system clock signal SCK from the controller 2*k*. Note that the fourth embodiment is similar to the first embodiment in that the control circuit 32 receives the system clock signal SCK before being logically inverted.

As described above, in the fourth embodiment, in the memory system 1k, the controller 2k distributes the system clock signal SCK to all the memory chips 3k in parallel. In other words, the controller 2k can control operation timings of the respective memory chips 3k by transmitting the system clock signal to the plurality of memory chips 3k-1 to 3k-4 in parallel by way of the parallel bus PBk and sequentially transmitting the chip select signal to the plurality of memory chips 3k-1 to 3k-4 by way of the loop bus LB.

FIFTH EMBODIMENT

A memory system according to a fifth embodiment will be described next. A part different from the first to fourth embodiments will be mainly described below.

While in the first embodiment, an example of a configuration where one bit of the data signal is transmitted, in the fifth embodiment, an example of a configuration where a plurality of bits of the data signal is transmitted in parallel. For example, by expanding a configuration of the controller and the memory chips for processing the data signal to support a plurality of bits and also expanding the SO output terminal to a plurality of output terminals, a mechanism for writing a plurality of bits can be easily implemented. The number of bits to be expanded may be, for example, 4 bits, 8 bits, 16 bits, or 32 bits.

Figure 11:
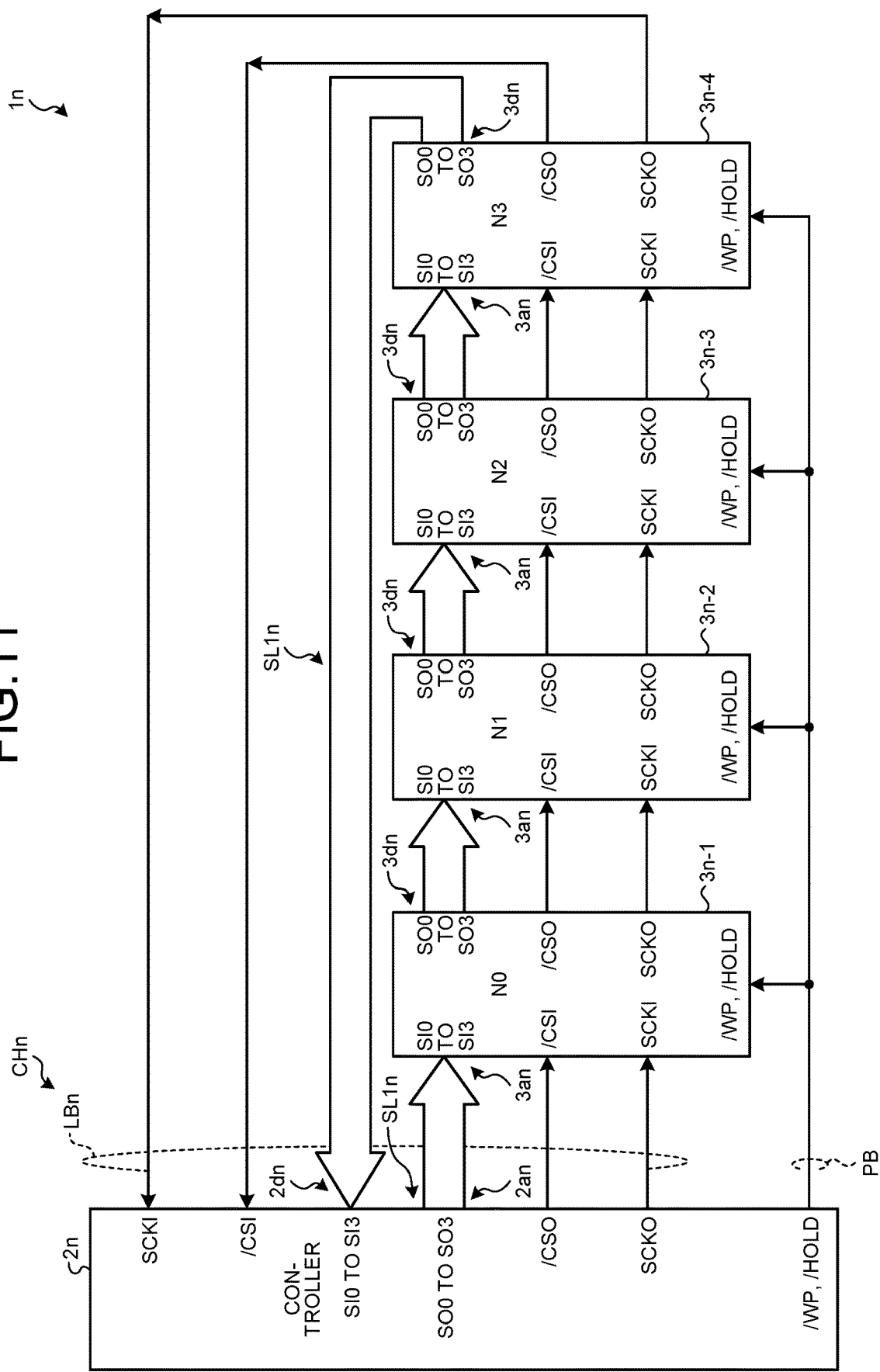
FIG. 11 is a view illustrating a configuration of a memory system according to a fifth embodiment.

Specifically, a memory system 1n can be constituted as illustrated in FIG. 11. FIG. 11 is a view illustrating a configuration of the memory system 1n. FIG. 11 illustrates an example of a configuration where four bits of a data signal are to be transmitted in parallel. The memory system 1n includes a controller 2n, a plurality of memory chips 3n-1 to 3n-4 and a channel CHn in place of the controller 2, the plurality of memory chips 3-1 to 3-4 and the channel CH (see FIG. 1).

At the controller 2n, the output terminal 2a is expanded to an output terminal group 2an for four bits, and the input terminal 2d is expanded to an input terminal group 2dn for four bits. At each of the memory chips 3n-1 to 3n-4, the input terminal 3a is expanded to an input terminal group San for four bits, and the output terminal 3d is expanded to an output terminal group 3dn for four bits. The channel CHn includes a loop bus LBn and a parallel bus PB. At the loop bus LBn, the signal line SL1 is expanded to a signal line group SL1n with a four-bit width. The signal line group SL1n extends from the output terminal group 2an of the controller 2n and returns to the input terminal 2d of the controller 2n by way of the input terminal group San and the output terminal group 3dn of the memory chip 3n-1, the input terminal group 3an and the output terminal group 3dn of the memory chip 3n-2, the input terminal group 3an and the output terminal group 3dn of the memory chip 3n-3, and the input terminal group 3an and the output terminal group 3dn of the memory chip 3n-4.

Figure 12:
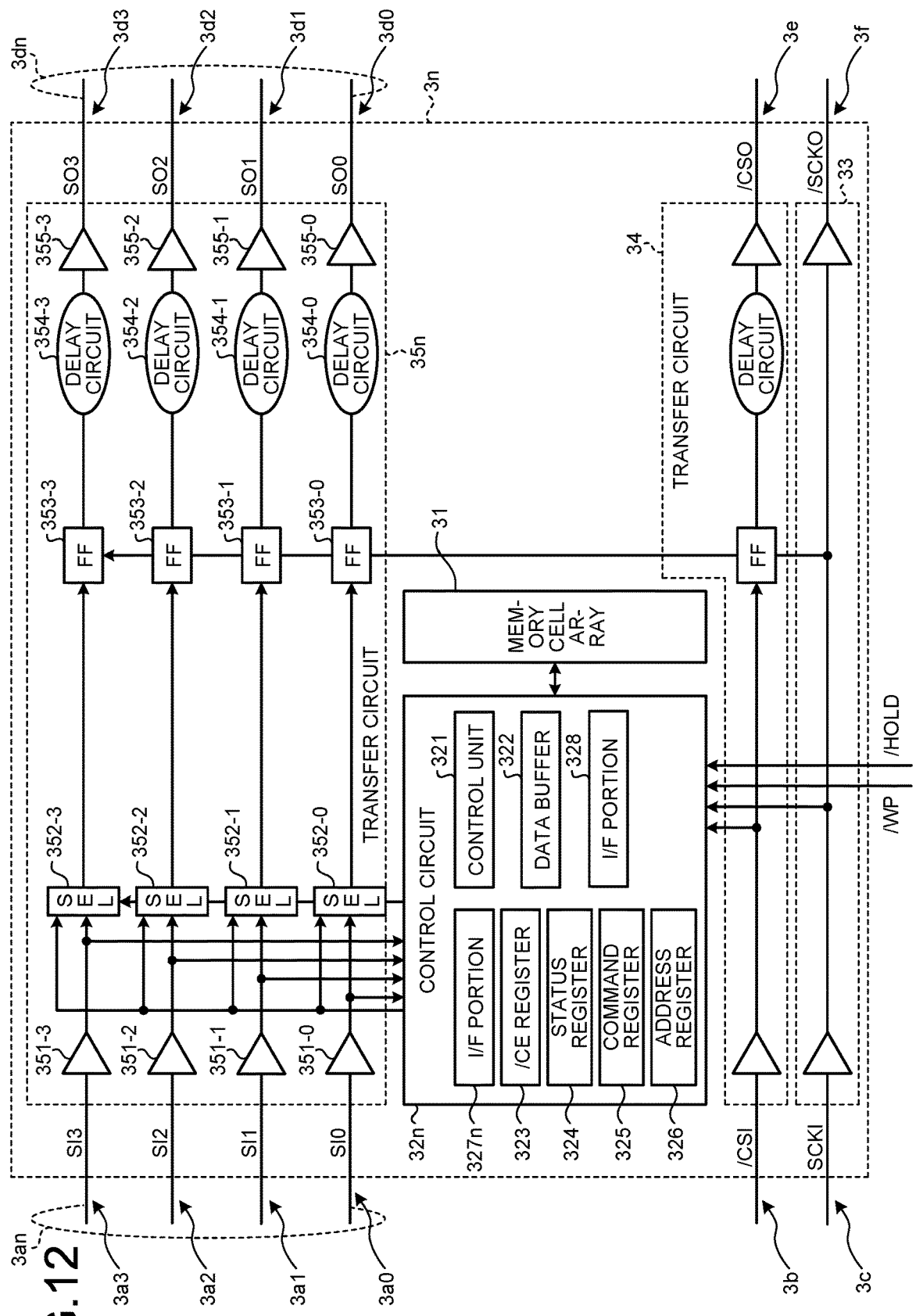
FIG. 12 is a view illustrating a configuration of a memory chip in the fifth embodiment.

In response to this, at each memory chip 3n, as illustrated in FIG. 12, the transfer circuit 35n is expanded to support four bits. FIG. 12 is a view illustrating a configuration of the memory chip 3n. The input terminal group 3an includes input terminals 3a0 to 3a3, and the output terminal group 3dn includes output terminals 3d0 to 3d3. A driver 351-0, a selector 352-0, a flip-flop 353-0, a delay circuit 354-0 and a driver 355-0 are sequentially connected on a path from the input terminal 3a0 to the output terminal 3d0 as a configuration corresponding to a 0-th bit of the data signal. A driver 351-1, a selector 352-1, a flip-flop 353-1, a delay circuit 354-1 and a driver 355-1 are sequentially connected on a path from the input terminal 3a1 to the output terminal 3d1 as a configuration corresponding to a first bit of the data signal. A driver 351-2, a selector 352-2, a flip-flop 353-2, a delay circuit 354-2 and a driver 355-2 are sequentially connected on a path from the input terminal 3a2 to the output terminal 3d2 as a configuration corresponding to a second bit of the data signal. A driver 351-3, a selector 352-3, a flip-flop 353-3, a delay circuit 354-3 and a driver 355-3 are sequentially connected on a path from the input terminal 3a3 to the output terminal 3d3 as a configuration corresponding to a third bit of the data signal.

In accordance with expansion of the transfer circuit 35n to support four bits, an IF portion 327n of the control circuit 32n performs parallel to serial return. In other words, in a case where the IF portion 327n receives a data signal of four bits in a parallel format, the IF portion 327n converts the data signal in a parallel format into a serial format and supplies the data signal of four bits to the control unit 321 and/or the data buffer 322 in a serial format. Further, in a case where the IF portion 327n receives a data signal of four bits in a serial format from the control unit 321 and/or the data buffer 322, the IF portion 327n converts the data signal in a serial format into a parallel format and supplies the data signal of four bits to the selectors 352-0 to 352-3 in a parallel format. Functions of other components are similar to the functions in the first embodiment.

As described above, in the fifth embodiment, the memory system 1n is constituted so as to transmit a plurality of bits of a data signal in parallel. This can improve transmission efficiency of a data signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
 a controller configured to output a first clock signal, a timing control signal and a data signal;
 a plurality of memory chips. each of the plurality of memory chips including at least:
  a clock input terminal;
  a timing control input terminal;
  a timing control output terminal;
  a data input terminal;
  a data output terminal;
  a clock generation circuit configured to generate a second clock signal in accordance with a transmitted clock signal;
  a first transfer circuit configured to transfer the timing control signal input via the timing control input terminal to a side of the timing control output terminal in synchronization with the generated second clock signal; and
  a second transfer circuit configured to transfer the data signal input via the data input terminal to a side of the data output terminal in synchronization with the generated second clock signal; and a channel including a loop bus that connects the controller and the plurality of memory chips in a ring shape, wherein the controller is configured to control operation timings of the plurality of memory chips by transmitting the first clock signal and the timing control signal to the plurality of memory chips via the channel.

2. The memory system according to claim 1, wherein the controller is configured to collectively access the plurality of memory chips via the channel to cause data to be written or data to be read.

3. The memory system according to claim 2, wherein the controller is further configured to output a command which designates a memory chip to be enabled to the channel as the data signal and access the designated memory chip.

4. The memory system according to claim 3, wherein
the command includes first information which designates a memory chip to be enabled, and
each of the plurality of memory chips is configured to determine whether or not an own chip is enabled in accordance with the first information upon reception of the command.

5. The memory system according to claim 3, wherein the controller is further configured to output the command to the channel, and then, output a write command and/or a read command to the channel.

6. The memory system according to claim 2, wherein
each of the plurality of memory chips further includes a chip enable input terminal,
the controller is further configured to output a chip enable signal which designates a memory chip to be enabled to the channel, and
each of the plurality of memory chips is configured to be designated with the chip enable signal input via the chip enable input terminal.

7. The memory system according to claim 6, wherein
the chip enable signal includes first information which designates a memory chip to be enabled, and
each of the plurality of memory chips is configured to determine whether or not an own chip is enabled in accordance with the first information upon reception of the chip enable signal.

8. The memory system according to claim 6,
wherein the controller is further configured to output the chip enable signal to the channel, and then, output a write command and/or a read command to the channel.

9. The memory system according to claim 6, wherein
the channel further includes a parallel bus which connects the plurality of memory chips in parallel to the controller,
the parallel bus is configured to transmit the chip enable signal to the plurality of memory chips in parallel, and
the loop bus is configured to sequentially transmit each of the timing control signal and the data signal to the plurality of memory chips.

10. The memory system according to claim 1, wherein
each of the plurality of memory chips further includes a clock output terminal, and
the loop bus is configured to sequentially transmit each of the second clock signal output via the clock output terminal of each of the plurality of memory chips, the timing control signal and the data signal to the plurality of memory chips.

11. The memory system according to claim 1, wherein
the channel further includes a parallel bus which connects the plurality of memory chips in parallel to the controller,
the parallel bus is configured to transmit the first clock signal to the plurality of memory chips in parallel, and
the loop bus is configured to sequentially transmit each of the timing control signal and the data signal to the plurality of memory chips.

12. The memory system according to claim 1, wherein each of the plurality of memory chips is configured to execute a command which complies with serial peripheral interface (SPI) standards.

13. The memory system according to claim 12, wherein the controller is configured to cause the plurality of memory chips to collectively execute a command which complies with the SPI standards via the channel.

14. A memory system comprising:
a controller configured to output a first clock signal, a timing control signal and a data signal;
a plurality of memory chips, each of the plurality of memory chips including at least a clock input terminal, a timing control input terminal, a timing control output terminal, N data input terminals and N data output terminals, N being an integer equal to or greater than 4; and
a channel including a loop bus that connects the controller and the plurality of memory chips in a ring shape, wherein the controller is configured to control operation timings of each of the plurality of memory chips by transmitting the first clock signal and the timing control signal to the plurality of memory chips via the channel,
the channel is configured to transmit the data signal with an N-bit width, and
the controller is configured to access at least one memory chip among the plurality of memory chips via the channel and perform at least one of write or read of data of N bits per one cycle of the first clock signal.

15. The memory system according to claim 14, wherein each of the plurality of memory chips further includes:
a clock generation circuit configured to generate a second clock signal in accordance with the transmitted first clock signal;
a first transfer circuit configured to transfer the timing control signal input via the timing control input terminal to a side of the timing control output terminal in synchronization with the generated second clock signal; and
a second transfer circuit configured to transfer the data signal input via the data input terminal to a side of the data output terminal in synchronization with the generated second clock signal.

16. The memory system according to claim 15, wherein
each of the plurality of memory chips further includes a clock output terminal, and
the loop bus is configured to sequentially transmit each of the second clock signal output via the clock output terminal of each of the plurality of memory chips, the timing control signal and the data signal to the plurality of memory chips.

17. The memory system according to claim 15, wherein
the channel further includes a parallel bus which connects the plurality of memory chips in parallel to the controller,
the parallel bus is configured to transmit the first clock signal to the plurality of memory chips in parallel, and
the loop bus is configured to sequentially transmit each of the timing control signal and the data signal to the plurality of memory chips.

18. The memory system according to claim 14,
wherein each of the plurality of memory chips is configured to execute a command which complies with serial peripheral interface (SPI) standards.

19. A memory system comprising:
a controller configured to output a first clock signal, a timing control signal and a data signal;
a plurality of memory chips, each of the plurality of memory chips including at least a clock input terminal, a timing control input terminal, a timing control output terminal, a data input terminal and a data output terminal; and
a channel including a loop bus that connects the controller and the plurality of memory chips in a ring shape, wherein
the controller is configured to:
   control operation timings of the plurality of memory chips by transmitting the first clock signal and the timing control signal to the plurality of memory chips via the channel;
   collectively access the plurality of memory chips via the channel to cause data to be written;
   output a command which designates a memory chip to be enabled to the channel as the data signal; and
   access the designated memory chip, and
the command includes first information which designates a memory chip to be enabled, and
each of the plurality of memory chips is configured to determine whether or not an own chip is enabled in accordance with the first information upon reception of the command.

20. The memory system according to claim 19, wherein the controller is further configured to output the command to the channel, and then, output a write command and/or a read command to the channel.

\* \* \* \* \*